(12) United States Patent
Wang

(10) Patent No.: US 12,347,956 B2
(45) Date of Patent: Jul. 1, 2025

(54) SOCKET CONNECTOR DEVICE WITH TERMINAL MODULE

(71) Applicants: SUYIN OPTRONICS CORP., New Taipei (TW); Cheng-Yang Li, New Taipei (TW); Chih-Yuan Wang, New Taipei (TW); Jih-Szu Wang, Keelung (TW)

(72) Inventor: Jih-szu Wang, New Taipei (TW)

( * ) Notice: Subject to any disclaimer, the term of this patent is extended or adjusted under 35 U.S.C. 154(b) by 419 days.

(21) Appl. No.: 17/979,026

(22) Filed: Nov. 2, 2022

(65) Prior Publication Data
US 2023/0140671 A1 May 4, 2023

(30) Foreign Application Priority Data
Nov. 2, 2021 (TW) .................. 110140850

(51) Int. Cl.
| | | |
|---|---|---|
| H01R 13/11 | (2006.01) | |
| H01R 13/52 | (2006.01) | |
| H01R 13/621 | (2006.01) | |
| H01R 13/645 | (2006.01) | |
| H01R 13/66 | (2006.01) | |

(52) U.S. Cl.
CPC ......... *H01R 13/11* (2013.01); *H01R 13/5213* (2013.01); *H01R 13/621* (2013.01); *H01R 13/6453* (2013.01); *H01R 13/665* (2013.01)

(58) Field of Classification Search
None
See application file for complete search history.

(56) References Cited

U.S. PATENT DOCUMENTS

| | | | |
|---|---|---|---|
| 7,563,144 B2 * | 7/2009 | Kunioka | H01R 12/714 439/700 |
| 11,067,603 B2 * | 7/2021 | Williams | H01R 13/6625 |

* cited by examiner

*Primary Examiner* — Ross N Gushi

(57) ABSTRACT

A socket connector device for mating with a central processing unit having conductive portions is provided. The socket connector device includes a circuit module, a terminal module, and a cover plate. The terminal module is placed on the circuit module. The terminal module includes a terminal block. The terminal module includes a terminal block, multiple rows of terminals integrally formed with the terminal block, and a support housing protecting the terminal block. Each terminal includes a first contact end and a second contact end corresponding to each other. The second contact end protrudes from the support housing. Each first contact end electrically contacts one conductive portion, and each second contact end electrically contacts the circuit module. The cover plate is rotatably assembled on the terminal module, so that the conductive portions of the central processing unit electrically contact or do not contact the terminals of the terminal block.

11 Claims, 9 Drawing Sheets

SOCKET CONNECTOR DEVICE WITH TERMINAL MODULE

CROSS REFERENCE TO RELATED APPLICATION

This application claims priority to Taiwan Patent Application No. 110140850, filed on Nov. 2, 2021, which is incorporated herein by reference in its entirety.

FIELD OF DISCLOSURE

The present invention provides a connector device, in particular, a socket connector device for use with a central processing unit.

DESCRIPTION OF RELATED ART

Competition and market demands promote development of faster and more efficient electrical systems. In particular, due to the demands and applications of central processing unit (CPU) technology, sizes of semiconductor central processing units are gradually shrinking. As there are more transistors per unit area, higher levels of integration are realized for the CPU, and the computing speed and efficiency are also increasing. That is to say, the design of CPU chips will continue to develop toward higher density computing, higher density storage, and tighter connection.

Conventional central processing unit (CPU) sockets connecting motherboards and CPU chips mainly utilize pin grid array (PGA) packaging technology. In the PGA packaging technology, pins are made on one side of the CPU, and can be directly inserted into small holes of the CPU socket to complete the installation. However, with the development of the CPUs, the way of connecting by pins no longer meets the requirements. Therefore, land grid array (LGA) packaging technology and ball grid array (BGA) packaging technology are provided. In the LGA packaging technology, pins are placed on the CPU socket to connect to the planar contact points on a bottom of the CPU chip. In the BGA packaging technology, pins are placed on the CPU socket to connect to solder ball contact points on a bottom of the CPU chip. Although the contact points of different CPU chips vary in number and arrangement, it can be certain that the CPU chips will have higher levels of integration and greater density in the future to meet the requirements of faster transmission speed, stronger computing capability, and efficiency.

However, since the pins on the conventional CPU sockets are formed by pressing, they are not suitable for a spacing between the contacts points of a high-integration chip. That is to say, the pins do not meet a minimum spacing between the contact points of the CPU chip. For chips with solder balls on the top, problems like solder skip or no solder sometimes occur when soldering the chips and a circuit board using surface mount technology (SMT). Insertion failure easily occur because the pins have no protection mechanism. Further, to make replacement, the chip using BGA packaging technology needs to be disassembled by using a hot air gun or reflow soldering, so the replacement process is complicated and difficult, and it is also easy to cause damage to the PCB. Accordingly, the inventor of the present invention has devoted himself to study the above-mentioned conventional techniques and tried his best to solve the above-mentioned problems to make improvement.

SUMMARY

It is an objective of the present invention to provide a socket connector device which can replace a connector used for a central processing unit (CPU) of a current/future motherboard. Each row of terminals has high strength, high transmission ability, a good supporting and elastic structure, and low power loss. The socket connector device is very suitable for the current/future high-transmission CPU or hybrid high-speed chips.

It is another objective of the present invention to provide a socket connector device which can maintain a direction of each terminal and prevent the terminals from being crooked due to collision of external forces. A service life of the terminals is prolonged.

The present invention provides a socket connector device mating with a central processing unit comprising a plurality of conductive portions, the socket connector device comprising: a circuit module, a terminal module, and a cover plate. The terminal module is disposed on and connected to the circuit module, wherein the terminal module comprises a terminal block, a plurality of rows of terminals integrally formed with the terminal block, and a support housing protecting the terminal block, each of the terminals comprises a first contact end and a second contact end, the first contact end and the second contact end are arranged corresponding to each other and protrude from the support housing, each of the first contact ends electrically contacts one of the conductive portions, and each of the second contact ends electrically contacts the circuit module. The cover plate is rotatably mounted on the terminal module to enable the conductive portions of the central processing unit to electrically contact or not contact the terminals of the terminal block.

In one embodiment, the terminal module further comprises a limiting member and an assembly component, the limiting member and the assembly component together limit and position the terminal block, the limiting member comprises a first positioning component and a plurality of rows of limiting slots, the first positioning component is detachably assembled to the support housing, the assembly component comprises a second positioning component and a plurality of rows of guiding through grooves, and the second positioning component is positioned and assembled to the support housing.

In one embodiment, the first positioning component comprises a plurality of hooks and a plurality of guide pins, the second positioning component comprises a plurality of elastic hooks and a plurality of positioning pins, the support housing comprises a plurality of first limiting holes, a plurality of first guiding holes, a plurality of second limiting holes, and a plurality of second guiding holes, each of the hooks and each of the guide pins are engaged with one of the first limiting holes and one of the first guiding holes, respectively, and each of the elastic hooks and each of the positioning pins are engaged with one of the second limiting holes and one of the second guiding holes, respectively.

In one embodiment, after the terminal block is positioned and assembled onto the assembly component and positioned to the support housing, the limiting member is assembled to the support housing, wherein the support housing further comprises a plurality of fixing holes for positioning and fastening the cover plate.

In one embodiment, each of the terminals further comprises a fastening portion connecting the first contact end and the second contact end of the terminal, and wherein in each of the terminals, the first contact end comprises a first extension portion and a first top portion connected to the first extension portion, the second contact end comprises a second extension portion and a second top portion connected to the second extension portion, and a thickness of the fastening portion is greater than a thickness of the first extension portion and a thickness of the second extension portion.

In one embodiment, the rows of the terminals are spaced apart from each other, any two adjacent rows of the terminals are oriented toward opposite directions, a distance between any two adjacent rows of the terminals ranges from 0.4 millimeter (mm) to 1 mm, and a spacing between any two adjacent terminals in each row of the terminals ranges from 0.2 mm to 0.9 mm.

In one embodiment, the limiting member further comprises a limiting recess for accommodating the central processing unit, and a shape of the limiting recess corresponds to an outline of the central processing unit.

In one embodiment, the circuit module further comprises a circuit substrate and a support plate positioned on the circuit substrate, the circuit substrate is provided with a plurality of conductive pads corresponding to the second contact ends, and each of the conductive pads is provided for electrically contacting one of the second contact ends.

In one embodiment, the circuit module further comprises a plurality of positioning elements, the circuit substrate and the support plate each comprise a plurality of through holes, and the positioning elements are inserted in the through holes to position the support plate on one side of the circuit substrate.

In one embodiment, the cover plate further comprises a cover body, two positioning brackets disposed on the cover body, and an operating lever pivotally connected to one side of the cover body, the two positioning brackets are rotatably positioned on the support housing, and the operating lever can be rotated to lift or cover the cover plate.

In one embodiment, the cover body further comprises a locking limiting portion and a limiting groove, the locking limiting portion protrudes from a front edge of the cover body for limiting rotation of the operating lever with respect to the cover body, and the limiting groove is defined at a position adjacent to one side of the locking limiting portion for positioning at least one fastener to keep a closed state of the cover plate.

In one embodiment, when to set the cover plate in a closed state, the operating lever is rotated to be restricted by the locking limiting portion, such that the cover body presses the central processing unit to make the central processing unit contact the terminals of the terminal block; and when to set the cover plate in an open state, the operating lever is rotated to be released from the restriction of the locking limiting portion, such that the cover body releases the central processing unit to make the central processing unit detached from the terminals of the terminal block.

The socket connector device of the present invention is easy to assemble and has design flexibility, and can be directly used to replace a connector of a current CPU, thus achieving high compatibility. A spacing between any two adjacent terminals in the terminal module ranges from 0.2 mm to 0.9 mm, so as to achieve an extremely fine-pitch structure, which meets the requirements for a gradually narrowing spacing between conductive portions of the current CPU. Each of the terminals also has high strength, high conductivity, and low impedance, so the terminals can alleviate a temperature rising problem caused by high impedance when transmitting signals or currents, which can not only improve overall transmission efficiency, but also prolong a service life.

BRIEF DESCRIPTION OF DRAWINGS

In order to make the above-mentioned content easier to understand, the present invention is described below with reference to the preferred embodiments and in combination with the accompanying drawings.

DETAILED DESCRIPTION OF EMBODIMENTS

Figure 1:
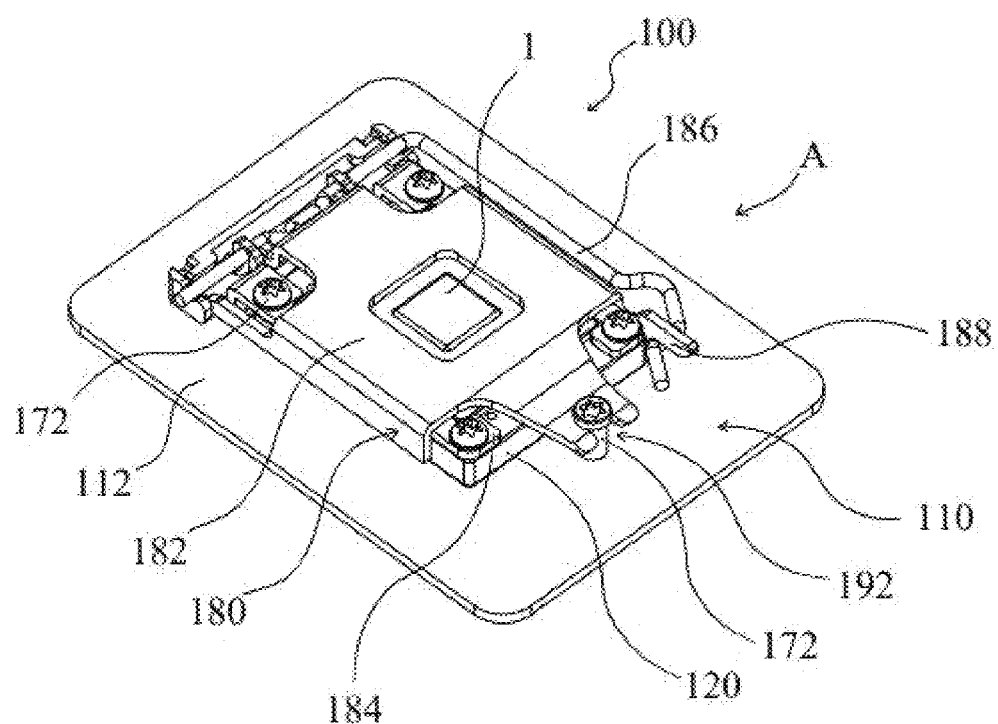
FIG. 1 is a schematic perspective view of a socket connector device in a closed state according to the present invention.

Please refer to the drawings, wherein the same reference numerals denote the same elements or similar elements, and working principles of the present disclosure are described by examples implemented in a suitable environment. The following description is based on illustrated embodiments of the present disclosure and should not be construed as limiting other embodiments of the present disclosure not detailed herein.

Figure 5:
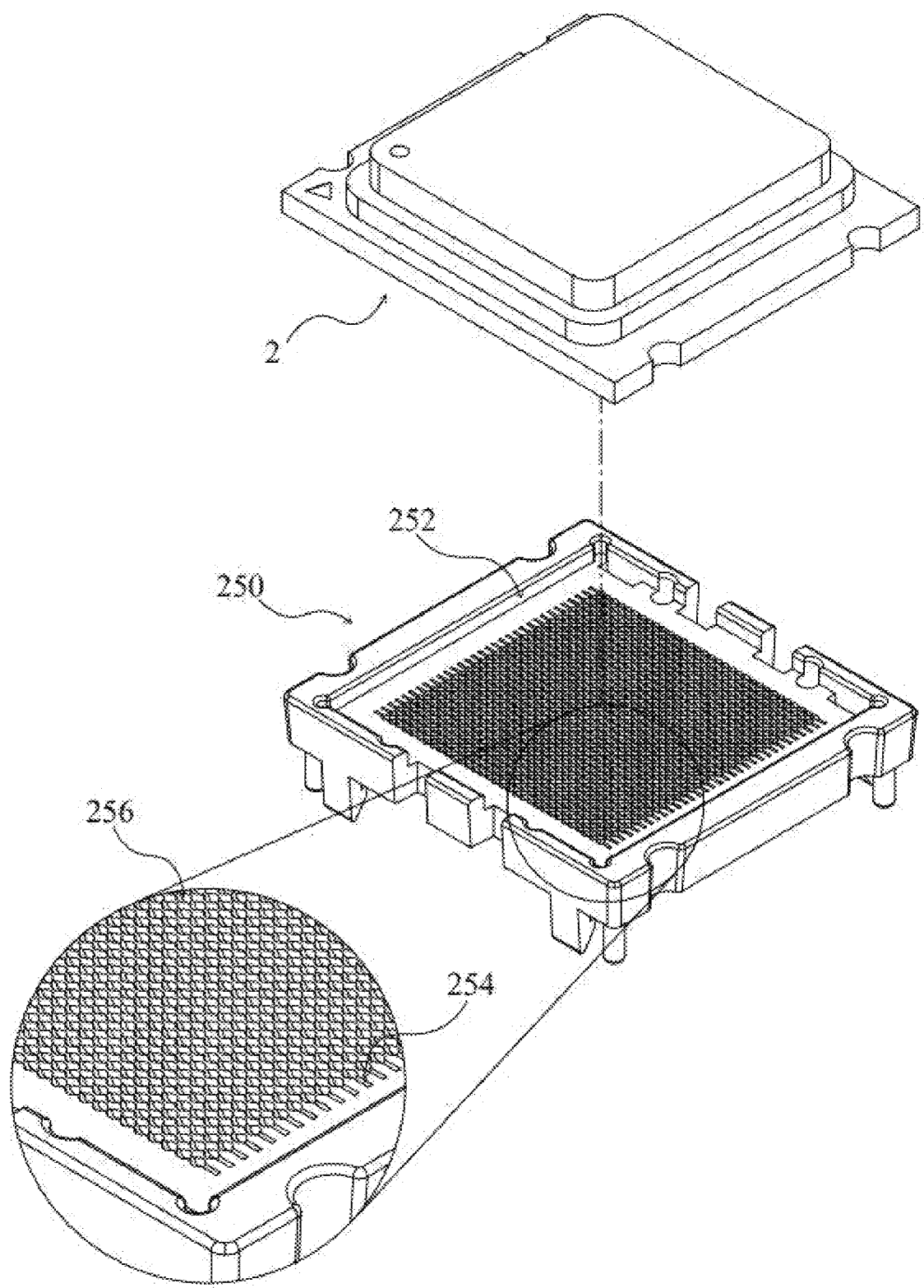
FIG. 5 is a schematic view illustrating the limiting member of the socket connector device according to another embodiment of the present invention.

As shown in FIG. 1, the present invention provides a socket connector device 100, which mates with a central processing unit (CPU) including a plurality of conductive portions (not illustrated). The central processing unit 1 uses ball grid array (BGA) package technology, that is, the conductive portions at a bottom are tin balls. However, in the embodiment shown in FIG. 5, a central processing unit 2 can also use land grid array (LGA) package technology, that is, the conductive portions at the bottom form a plane. No matter what packaging technology is adopted by the central processing units 1 and 2, each conductive portion of the central processing unit 1 is in contact with a circuit module 110 through a terminal module 120 in this embodiment.

Figure 2:
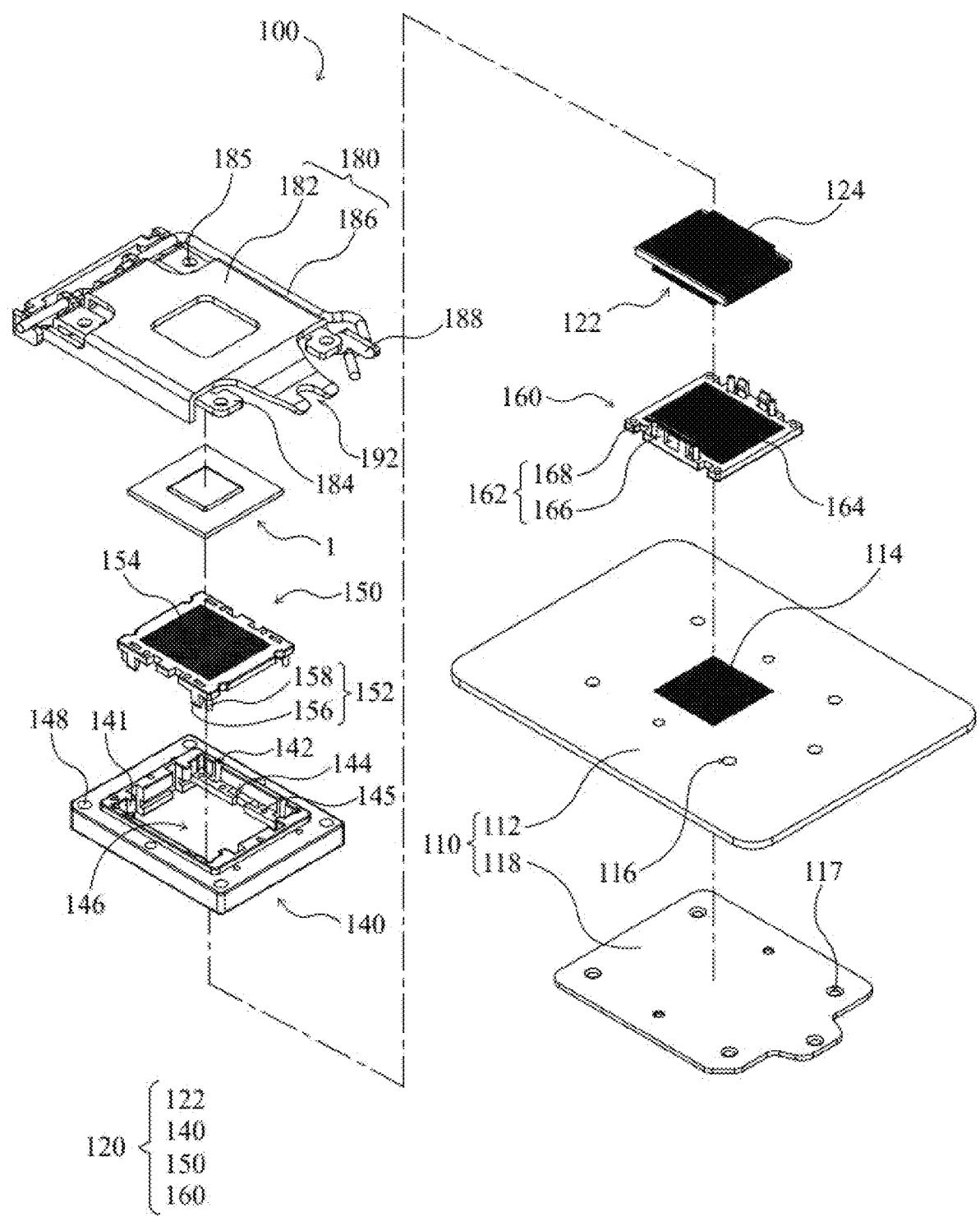
FIG. 2 is a perspective exploded view of the socket connector device of the present invention.

FIG. 1 and FIG. 2 are a perspective view of the socket connector device of the present invention in a closed state and a perspective exploded view. As shown in the drawings, the socket connector device 100 includes the circuit module 110, the terminal module 120, and a cover plate 180. The terminal module 120 can be electrically connected to the circuit module 110. The terminal module 120 includes a terminal block 122, a plurality of rows of terminals 124 integrally formed with the terminal block 122, and a support housing 140 for protecting the terminal block 122. Each terminal 124 includes a first contact end 125 and a second contact end 128. The first contact end 125 and the second contact end 128 are arranged corresponding to each other and protrude out of an insertion through hole 146 of the support housing 140, so that each of the first contact ends 125 can electrically contact one of the conductive portions, each of the second contact ends 128 can electrically contact a conductive pad 114 of the circuit module 110 (FIG. 2). The cover plate 180 is rotatably mounted on the terminal module 120 to enable the conductive portions of the central processing unit 1 to electrically contact or not contact the respective terminals 124 of the terminal block 122.

Figure 3:
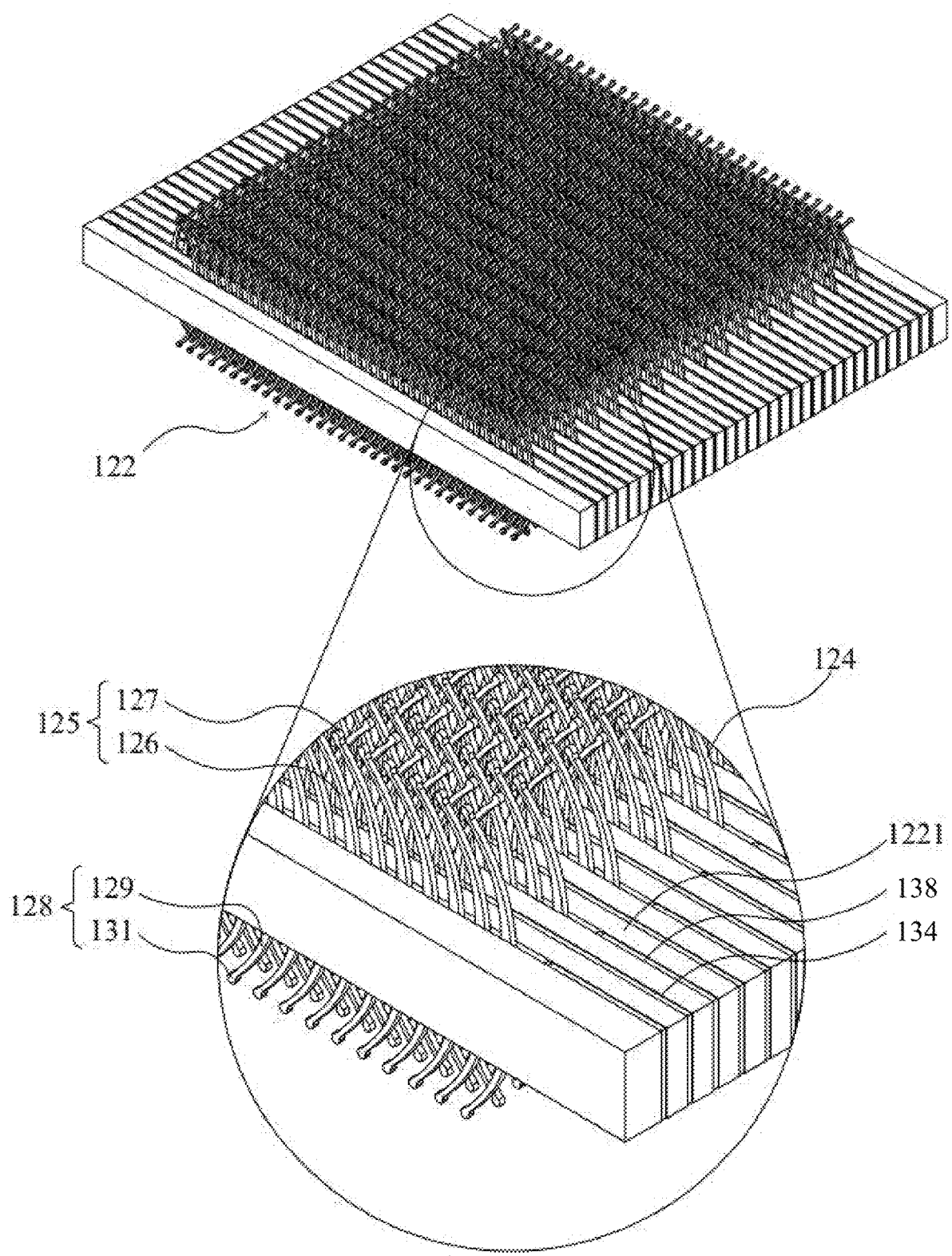
FIG. 3 is a schematic enlarged perspective view of a terminal block of the socket connector device of the present invention.
Figure 4:
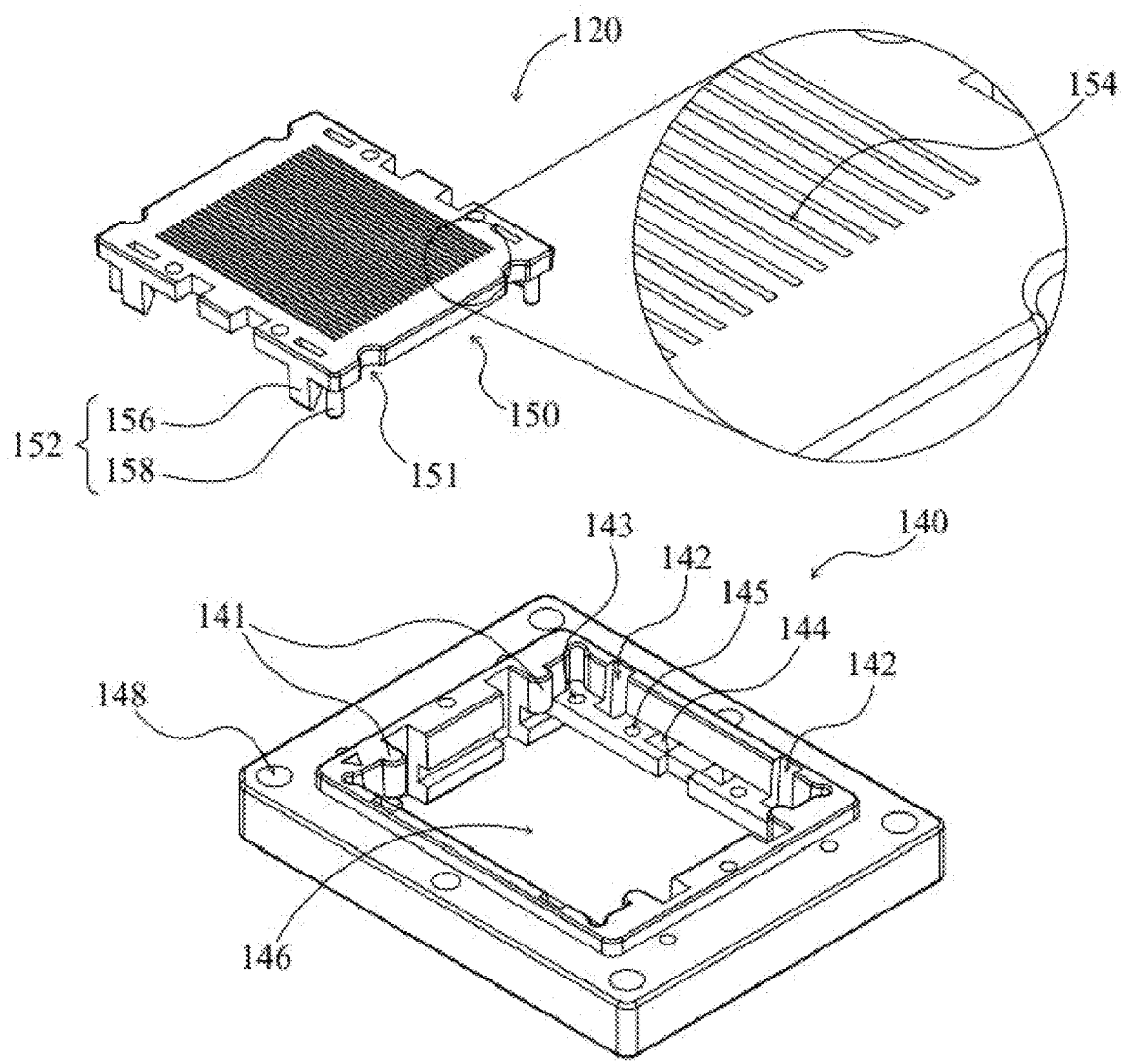
FIG. 4 is a perspective exploded view of a support housing, a limiting member, and an assembly component in a terminal module of the present invention.
Figure 4:
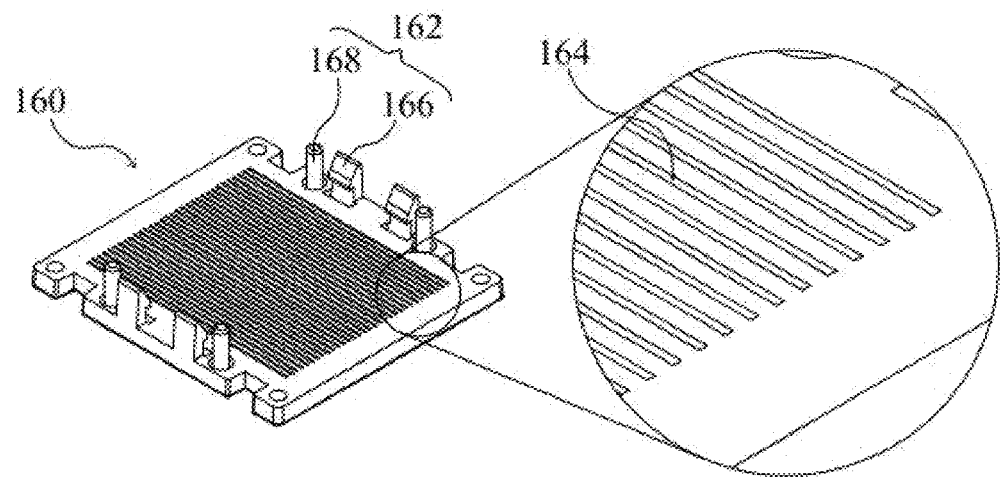

Please refer to FIG. 3 and FIG. 4 together. FIG. 3 is a perspective enlarged view of the terminal block of the socket connector device of the present invention. FIG. 4 is a perspective exploded view illustrating the support housing, the limiting member, and the assembly component in the terminal module of the present invention. In the embodiment shown in FIG. 3, the terminal block 122 is preferably composed of a base portion 1221 and a conductive layer 134 disposed on one side of the base portion 1221. The rows of the terminals 124 arranged in an array are formed after chemical processes such as exposure, development, and etching and then adhered to the base portion 1221 through an adhesive layer 138 adhered to the rows of terminals 124. The above steps are repeated to form the terminal block 122 having the rows of the terminals 124. A material of the conductive layer 134 is selected from a group consisting of beryllium copper alloy, phosphor bronze, nickel titanium alloy, or copper alloy. A material of the base portion 1221 is selected from a group consisting of epoxy resin (FR4), polyimide, ceramic, or other suitable insulating materials.

It should be noted that the rows of the terminals 124 are spaced apart from each other by the base portions 1221, and the terminals of any two adjacent rows of the terminals 124 are provided facing opposite directions, so that a distance between any two adjacent rows of the terminals 124 can be reduced to be, for example, between 0.4 millimeter (mm) and 1 mm. In addition, a spacing between any two adjacent terminals 124 in each row of the terminals 124 is between 0.2 mm and 0.9 mm, so as to achieve an extremely fine-pitch structure and satisfy the requirements for the current CPU 1 which has a gradually reduced spacing between the conductive portions. The first contact end 125 of each terminal 124 includes a first extension portion 126 and a first top portion 127 connected to the first extension portion 126. The second contact end 128 includes a second extension portion 129 and a second top portion 131 connected to the second extension portion 129. A fastening portion 133 (FIG. 10) connects the first contact end 125 and the second contact end 128. The fastening portion 133 can be positioned in the base portion 1221, wherein a thickness of the fastening portion 133 is greater than a thickness of the first extension portion 126 and a thickness of the second extension 129, thus providing better structural strength and stable signal transmission characteristics.

In the embodiment shown in FIG. 4, the terminal module 120 further includes a limiting member 150 and an assembly component 160. The limiting member 150 and the assembly component 160 together limit and position the terminal block 122. The limiting member 150 includes a first positioning component 152 and a plurality of rows of limiting slots 154. The first positioning component 152 is detachably assembled to the support housing 140. The assembly component 160 includes a second positioning component 162 and a plurality of rows of guiding through grooves 164. The second positioning component 162 is positioned and assembled to the support housing 140.

The first positioning component 152 includes at least one hook 156 and at least one guide pin 158. The second positioning component 162 includes at least one elastic hook 166 and at least one positioning pin 168. The support housing 140 includes at least one first limiting hole 142, at least one first guiding hole 143, at least one second limiting hole 144, and at least one second guiding hole 145. The hook 156 and the guide pin 158 are correspondingly fastened to the first limiting hole 142 and the first guiding hole 143, respectively. The elastic hook 166 and the positioning pin 168 are correspondingly fastened to the second limiting hole 144 and the second guiding hole 145, respectively. After the terminal block 122 is positioned and assembled to the assembly component 160 and positioned on one side (a rear side) of the support housing 140, the limiting member 150 is assembled to another side (a front side) of the support housing 140.

Specifically, the support housing 140 is preferably a rectangular housing, and further includes a plurality of foolproof protrusions 141, the insertion through hole 146 extending through the rectangular housing, and a plurality of fixing holes 148. The limiting member 150 is provided with a plurality of positioning grooves 151 corresponding to the respective foolproof protrusions 141, so that the limiting member 150 is assembled to the support housing 140 in a correct direction and is fastened to the limiting hole 142 and the guiding hole 143 by means of the first positioning component 152. The fixing holes 148 defined in a periphery of the support housing 140 are used for assembling and fastening the cover plate 180. In the embodiment shown in FIG. 2 to FIG. 4, a preferred assembling method of the terminal module 120 is as follows. First, the terminal block 122 is positioned and assembled to the assembly component 160 and positioned on the support housing 140, and the limiting member 150 is assembled to the support housing 140, so that assembling of the terminal module 120 is complete. However, in alternative embodiments, the terminal block 122 of the terminal module 120 can also be formed in the support housing 140 through plastic injection insert molding, which can be changed according to needs and designs.

Referring to FIGS. 3 and 4, when the terminal block 122 is assembled to the support housing 140, each of the first contact ends 125 and each of the second contact ends 128 of the terminal block 122 can protrude from one row of the limiting slots 154 and one row of the guiding through grooves 164, respectively. Each of the first contact ends 125 electrically contacts one of the conductive portions. Each of the second contact ends 128 electrically contacts one of the conductive pads 114 of the circuit module 110 (see FIG. 6). Due to the arrangement of the rows of the limiting slots 154 and the rows of the guiding through grooves 164, the first contact ends 125 and the second contact ends 128 can maintain the direction of each terminal 124 and prevent the terminals 124 from being crooked due to collision of external forces. A service life of the terminals 124 and the terminal block 122 is prolonged.

In addition, an overall structure of the limiting member 140, the terminal block 122, and the assembly component 160 can be quickly re-designed and modified according to the conductive portions of the CPU 1 or different requirements. In particular, in the embodiments shown in FIG. 1 to FIG. 4, the limiting member 150 is preferably suitable for the CPU 1 in which the conductive portions are solder balls (BGA). However, in the embodiment shown in FIG. 5, a limiting member 250 can be suitable for the CPU 2 in which the conductive portions form a flat surface (LGA). The limiting member 250 further includes a limiting recess 252 for accommodating a CPU 2. A shape of the limiting recess 252 corresponds to an outline of the CPU 2, so that the CPU 2 is installed on one side of the limiting member 252, and another side of the limiting member 252 is detachably assembled to the support housing 140. Each row of limiting slots 254 of the limiting member 252 further includes a plurality of arc through-holes 256 which communicate with the limiting slot 254 and have greater diameters than a width of the limiting slot 254. The arc through-holes 256 are provided for the first contact ends to pass through, respectively. Other structural details of the limiting member 252 are the same as those in the foregoing embodiments, and are omitted herein for brevity.

Figure 6:
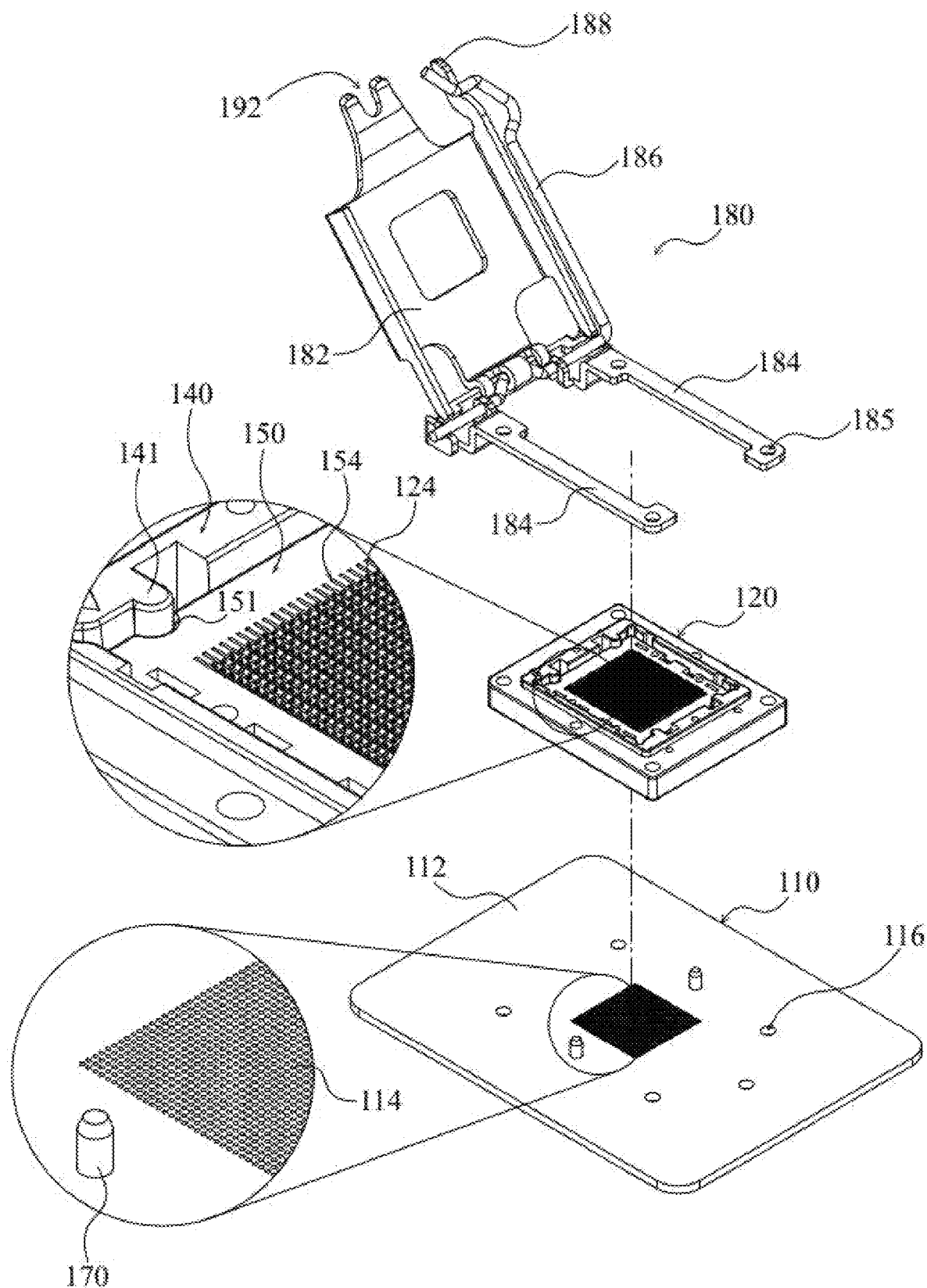
FIG. 6 is a schematic perspective exploded view illustrating a cover plate, a support housing, and a circuit module.
Figure 7:
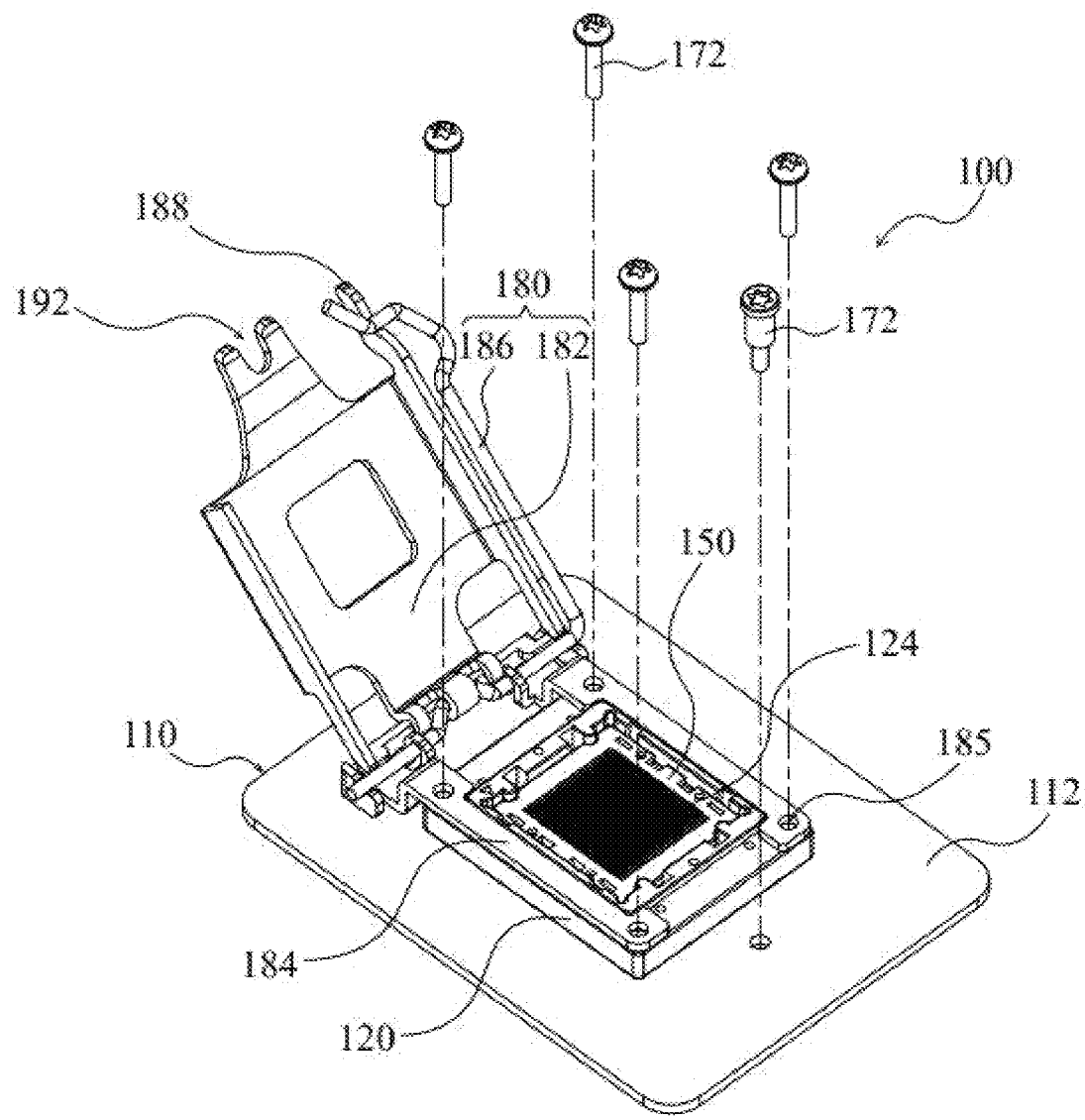
FIG. 7 is a schematic perspective view illustrating FIG. 6 after assembled.
Figure 8:
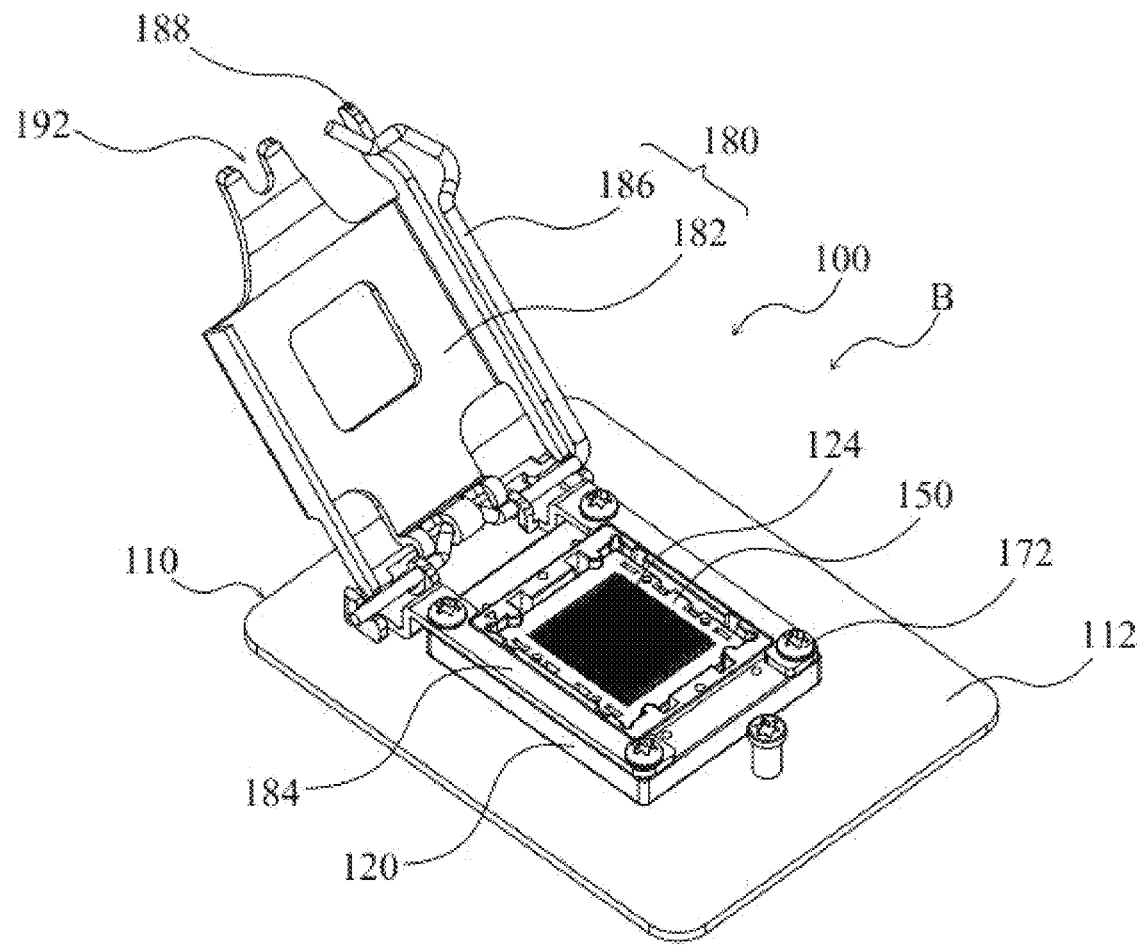
FIG. 8 is a schematic perspective view showing FIG. 7 with fasteners installed and is also a schematic perspective view showing the cover plate in an open state.

Please refer to FIG. 6 to FIG. 8 together. FIG. 6 is a perspective exploded view of the cover plate, the support housing, and the circuit module of the present invention. FIG. 7 is a perspective assembled view of FIG. 6. FIG. 8 is a schematic perspective view showing that fasteners of FIG. 7 are installed, and is also a perspective view showing the cover plate in an open state. As shown in the drawings, the circuit module 110 further includes a circuit substrate 112, such as a mother board or other suitable printed circuit board (PCB), and a support plate 118 (FIG. 2) positioned on the circuit substrate 112. The support plate 118 is, for example, a metal material to provide structural strength or other suitable functions for the circuit substrate 112. Specifically, the support plate 118 is positioned on the support housing 140 by means of a plurality of positioning elements 170, such as positioning pins, inserted in the through holes 117 and 116. The circuit substrate 112 is also provided with a plurality of conductive pads 114 corresponding to the second contact ends 128, and each of the conductive pads 114 is provided for electrically contacting the second top portion 131 of each of the second contact ends 128 to perform arithmetic and logical operations and interpret every command inside computer systems/servers and controls operations.

The cover plate 180 further includes a cover body 182, two positioning brackets 184 disposed on the cover body 182, and an operating lever 186 pivotally connected to one side of the cover body 182. The two positioning brackets 184 are rotatably positioned on the fixing holes 148 of the support housing 140, and the operating lever 186 can rotatably lift or cover the cover plate 180. Specifically, the cover body 180 further includes a locking limiting portion 188 and a limiting groove 192. The locking limiting portion 188 protrudes from a front edge of the cover body 182 for limiting rotation of the operating lever 186 with respect to the cover body 182. The limiting groove 192 is defined at a position adjacent to one side of the locking limiting portion 188 for positioning at least one fastener 172 such as a screw or other suitable fastening element, so as to keep the closed state of the cover plate 180 (as shown in FIG. 1).

As shown in FIG. 1, the operating lever 186 is rotated to be restricted by the locking limiting portion 188 to set the cover plate 180 in a closed state A, so that the cover body 182 presses the CPU 1 to contact the terminals 124 of the terminal block 122. As shown in FIG. 8, the operating lever 186 is rotated to be released from the restriction of the locking limiting portion 188 to set the cover plate 180 in an open state B, such that the cover body 182 releases the CPU 1 to make the CPU 1 detached from the terminals 124 of the terminal block 122.

Specifically, the operating lever 186 is preferably a rod body and is pivotally connected to a bottom end of the cover body 182. In the closed state A, the fastener 172 can pass through the limiting groove 192 to be fixed on the circuit module 110, so that the cover plate 180 can stably press and fix the CPU 1. On the contrary, when the CPU 1 needs to be replaced or changed, the fastener 172 needs to be removed first, and the operating lever 186 is rotated to be released from the restriction of the locking limiting portion 188, so that the cover body 182 is rotated to be set in the open state B with respect to the terminal module 120.

Figure 9:
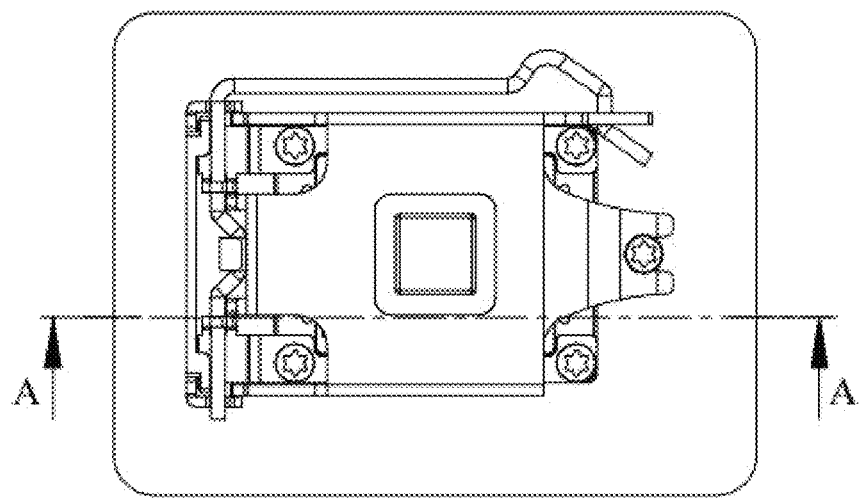
FIG. 9 is a cross-sectional view taken along line A-A showing the socket connector device.
Figure 10:
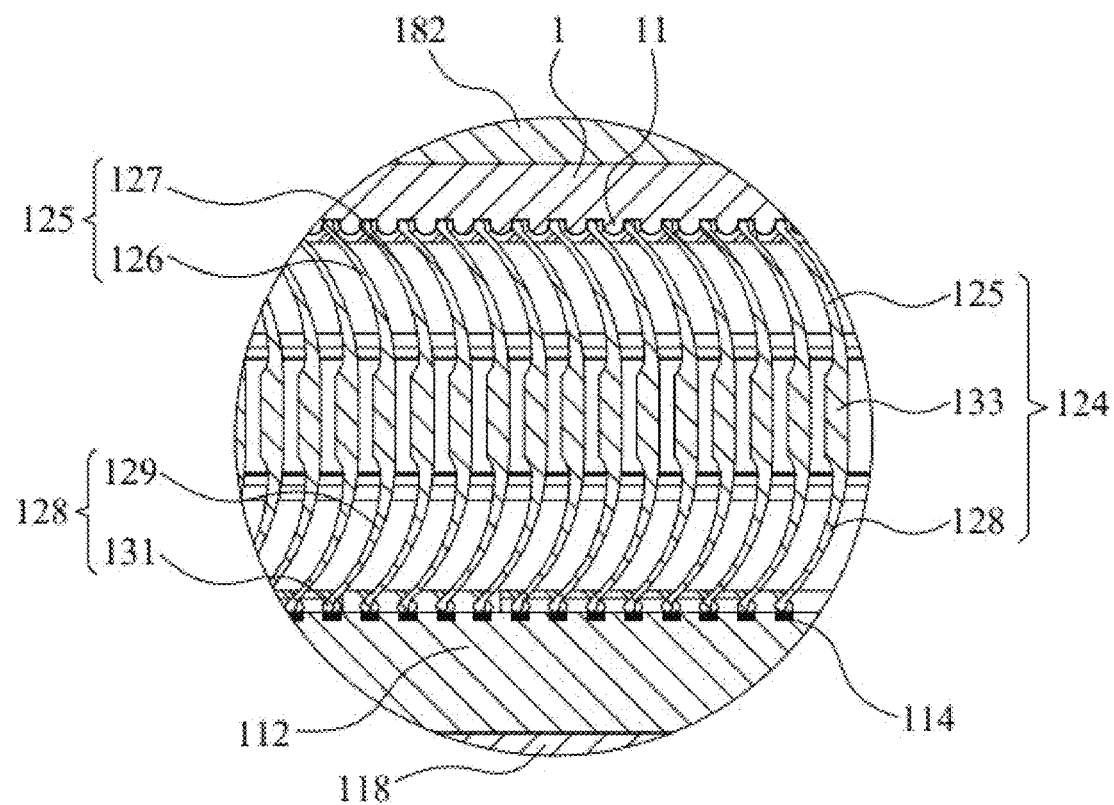
FIG. 10 is a schematic enlarged view showing position B of FIG. 9.

Please refer to FIG. 9 and FIG. 10 together. FIG. 9 is a cross-sectional view taken along line A-A showing the socket connector device of the present invention. FIG. 10 is a schematic enlarged view of position B of FIG. 9. When the socket connector device 100 is in the closed state A, the first contact ends 125 of each row of the terminals 124 are in elastic contact with the conductive portions 11 of the CPU 1, respectively, and the second contact ends 128 of each row of the terminals 124 are in elastic contact with the conductive pads 114 of the circuit substrate 112, respectively, so signals of the conductive portions 11 of the CPU 1 can be transmitted to the conductive pads 114 of the circuit substrate 112 through the first contact ends 125 and the second contact ends 128 of the terminals 124, thereby performing arithmetic and logical operations and interpreting every command in the computer system/server and controlling operations.

Because the terminal module 120 has a very fine pitch between the terminals 124 in each row, the socket connector device can replace a connector used for the CPU 1 of a current/future motherboard. Furthermore, each row of the terminals 124 also has high strength, high transmission ability, a good supporting and elastic structure, and low power loss, the terminals 124 are very suitable for the current/future high-transmission central processing unit 1 or hybrid high-speed chips.

The socket connector device 200 of this embodiment is easy to assemble and has design flexibility, and can be directly used to replace a connector of the conventional CPU 1, thus achieving high compatibility. The spacing between any two adjacent terminals 124 in the terminal module 120 is between 0.2 mm and 0.9 mm, so as to achieve an extremely fine-pitch structure, which meets the requirements for the gradually narrowing spacing between the conductive portions of the current CPU 1. Each of the terminals 124 also has high-strength, high-conductivity, and low-impedance, so the terminals 12 can alleviate the temperature rising problem caused by high impedance when transmitting signals or currents, which can not only improve the overall transmission efficiency, but also prolong the service life.

The above only describes preferred embodiments of the present invention, and is not intended to limit the protection scope of the present invention. Other equivalent changes based on the spirit of the present invention shall all fall within the protection scope of the present invention.

What is claimed is:

1. A socket connector device, mating with a central processing unit comprising a plurality of conductive portions, the socket connector device comprising:
  a circuit module;
  a terminal module disposed on and connected to the circuit module, wherein the terminal module comprises a terminal block, a plurality of rows of terminals assembled into the terminal block, a limiting member, an assembly component, and a support housing protecting the terminal block, each of the terminals comprises a first contact end and a second contact end, the first contact end and the second contact end are arranged corresponding to each other and protrude from the support housing, each of the first contact ends electrically contacts one of the conductive portions, and each of the second contact ends electrically contacts the circuit module, the limiting member and the assembly component together limit and position the terminal block, the limiting member comprises a first positioning component and a plurality of rows of limiting slots, the first positioning component is detachably assembled to the support housing, the assembly component comprises a second positioning component and a plurality of rows of guiding through grooves, and the second positioning component is positioned and assembled to the support housing; and a cover plate rotatably mounted on the terminal module to enable the conductive portions of the central processing unit to electrically contact or not contact the terminals of the terminal block.

2. The socket connector device according to claim 1, wherein the first positioning component comprises a plurality of hooks and a plurality of guide pins, the second positioning component comprises a plurality of elastic hooks and a plurality of positioning pins, the support housing comprises a plurality of first limiting holes, a plurality of first guiding holes, a plurality of second limiting holes, and a plurality of second guiding holes, each of the hooks and each of the guide pins are engaged with one of the first limiting holes and one of the first guiding holes, respectively, and each of the elastic hooks and each of the positioning pins are engaged with one of the second limiting holes and one of the second guiding holes, respectively.

3. The socket connector device according to claim 2, wherein after the terminal block is positioned and assembled onto the assembly component and positioned to the support housing, the limiting member is assembled to the support housing, and wherein the support housing further comprises a plurality of fixing holes for positioning and fastening the cover plate.

4. The socket connector device according to claim 1, wherein each of the terminals further comprises a fastening portion connecting the first contact end and the second contact end of the terminal, and wherein in each of the terminals, the first contact end comprises a first extension portion and a first top portion connected to the first extension portion, the second contact end comprises a second extension portion and a second top portion connected to the second extension portion, and a thickness of the fastening portion is greater than a thickness of the first extension portion and a thickness of the second extension portion.

5. The socket connector device according to claim 1, wherein the rows of the terminals are spaced apart from each other, any two adjacent rows of the terminals are oriented toward opposite directions, a distance between any two adjacent rows of the terminals ranges from 0.4 millimeter (mm) to 1 mm, and a spacing between any two adjacent terminals in each row of the terminals ranges from 0.2 mm to 0.9 mm.

6. The socket connector device according to claim 1, wherein the limiting member further comprises a limiting recess for accommodating the central processing unit, and a shape of the limiting recess corresponds to an outline of the central processing unit.

7. The socket connector device according to claim 1, wherein the circuit module further comprises a circuit substrate and a support plate positioned on the circuit substrate, the circuit substrate is provided with a plurality of conductive pads corresponding to the second contact ends, and each of the conductive pads is provided for electrically contacting one of the second contact ends.

8. The socket connector device according to claim 7, wherein the circuit module further comprises a plurality of positioning elements, the circuit substrate and the support plate each comprise a plurality of through holes, and the positioning elements are inserted in the through holes to position the support plate on one side of the circuit substrate.

9. The socket connector device according to claim 1, wherein the cover plate further comprises a cover body, two positioning brackets disposed on the cover body, and an operating lever pivotally connected to one side of the cover body, the two positioning brackets are rotatably positioned on the support housing, and the operating lever can be rotated to lift or cover the cover plate.

10. The socket connector device according to claim 9, wherein the cover body further comprises a locking limiting portion and a limiting groove, the locking limiting portion protrudes from a front edge of the cover body for limiting rotation of the operating lever with respect to the cover body, and the limiting groove is defined at a position adjacent to one side of the locking limiting portion for positioning at least one fastener to keep a closed state of the cover plate.

11. The socket connector device according to claim 9, wherein when to set the cover plate in a closed state, the operating lever is rotated to be restricted by the locking limiting portion, such that the cover body presses the central processing unit to make the central processing unit contact the terminals of the terminal block; and when to set the cover plate in an open state, the operating lever is rotated to be released from the restriction of the locking limiting portion, such that the cover body releases the central processing unit to make the central processing unit detached from the terminals of the terminal block.

* * * * *